United States Patent [19]

Horbach

[11] 3,993,381
[45] Nov. 23, 1976

[54] INTERMEDIATE CONNECTOR
[76] Inventor: Stephen Horbach, 40 Glen Road, Mountain Lakes, N.J. 07046
[22] Filed: July 18, 1975
[21] Appl. No.: 597,397

Related U.S. Application Data
[63] Continuation-in-part of Ser. No. 521,049, Nov. 5, 1974, abandoned.

[52] U.S. Cl. .................. 339/17 CF; 339/176 MP
[51] Int. Cl.² ..................................... H05K 1/04
[58] Field of Search ......... 339/17 C, 17 CF, 176 M, 339/176 MP, 258 R, 258 P

[56] References Cited
UNITED STATES PATENTS

| 3,697,926 | 10/1972 | Krafthefer | 339/176 MP |
| 3,820,054 | 6/1974 | Clewes et al. | 339/17 CF |
| 3,846,734 | 11/1974 | Pauza et al. | 339/17 CF |

FOREIGN PATENTS OR APPLICATIONS

| 1,261,605 | 4/1961 | France | 339/176 MP |
| A83,076 | 4/1964 | France | 339/176 MP |
| 1,032,414 | 6/1966 | United Kingdom | 339/176 MP |

Primary Examiner—Roy Lake
Assistant Examiner—Neil Abrams
Attorney, Agent, or Firm—McAulay, Fields, Fisher & Goldstein

[57] ABSTRACT

A connector intermediate between IC and PC board. The terminal of the connector having a prong portion for connection to the PC. An upper portion of the terminal being contained in a pocket of the connector housing. The upper portion being firmly held in the pocket by virtue of a retainer segment seated against the floor of the pocket and a curved portion resiliently held between opposing vertical walls. The curved portion includes a segment to contact and hold a terminal of the IC. The curved portion terminates in an inwardly turned segment closely spaced from the retainer segment.

4 Claims, 8 Drawing Figures

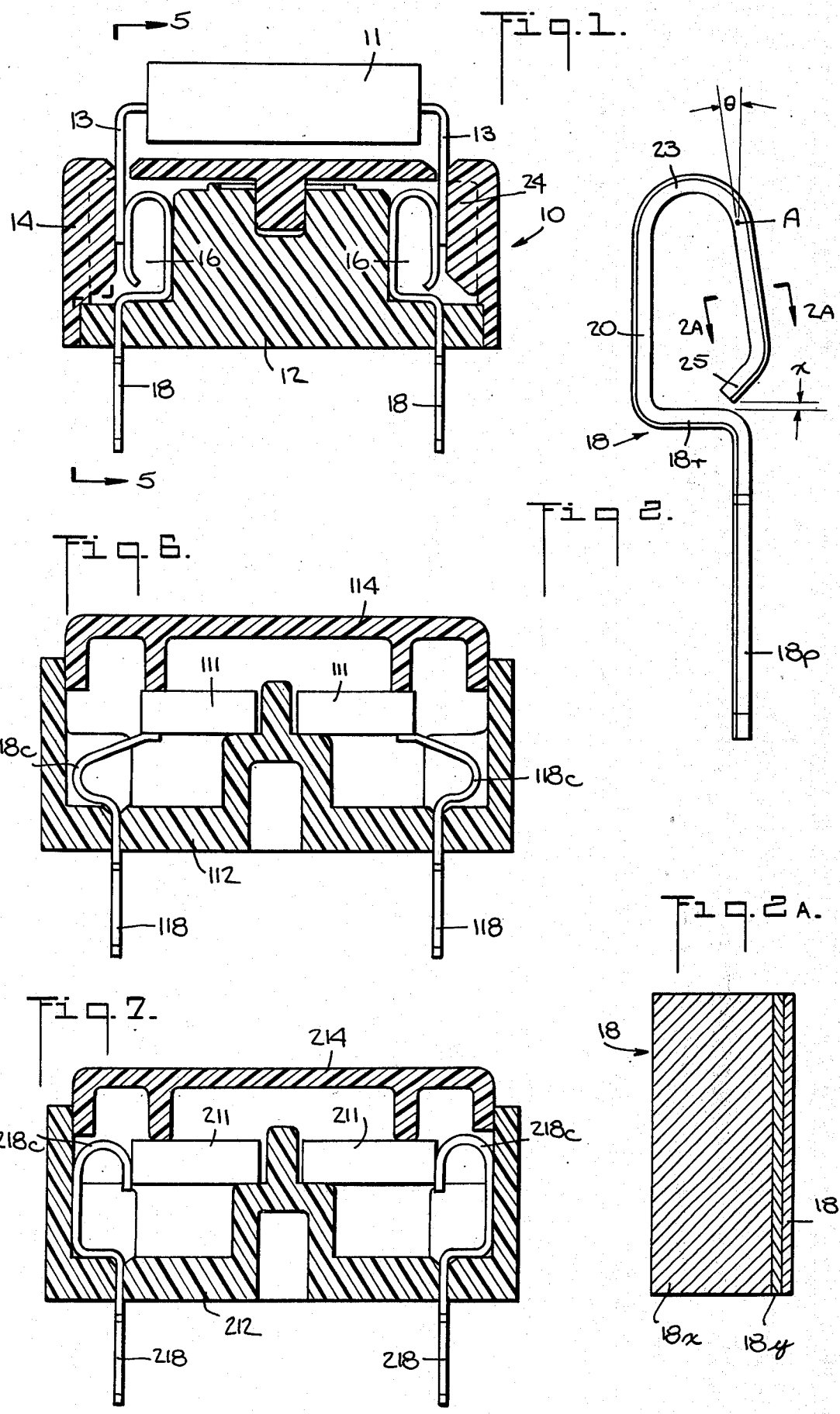

INTERMEDIATE CONNECTOR

REFERENCE TO RELATED APPLICATIONS

This is a continuation-in-part of my co-pending patent application Ser. No. 521,049 filed Nov. 5, 1974, now abandoned and entitled Intermediate Connector.

BACKGROUND OF THE INVENTION

In the application of MSI and LSI integrated circuit (IC) components, the IC device must be electrically connected to its associated circuitry. Two methods are commonly applied.

A first method involves direct mounting to a printed circuit (PC) board where each terminal of the IC is soldered to the circuit pattern. This method is least costly, allows high packaging density and provides high reliability.

A second method involves an intermediate component referred to as a connector or socket, having a corresponding number and terminal arrangement as the IC employed. The intermediate connector is permanently soldered to the printed circuit board and the IC is plugged into the connector. Electrical connection of the IC to the PC board circuit is invariably achieved through spring contacts in the intermediate connector. Each spring contact includes a prong which extends beyond the base of the intermediate connector. The prong portions of the spring contacts enter the holes in the PC board and are soldered to the circuit pattern. The use of the intermediate connector is advantageous due to the ease of replacing a defective IC and, in trouble shooting, of replacing a suspected defect with a funcationally good unit. The cost of the socket is offset by the savings that arise from the rapid repair made possible.

Today's trend is toward the intermediate connector approach. Replacement and service are made easier and quicker. Despite the cost of the added socket economics favor this method. However, unless the intermediate connector possesses the required physical and electrical characteristics equipment reliability can be adversely affected.

Accordingly, the major purpose of this invention is to provide an intermediate connector for use between an PC board and an IC circuit; the connector having an optimum combination of ease of repair, ease of assembly and reliability characteristics.

More specifically, the purposes of this invention are to provide an intermediate connector that will maintain contact and stability under vibration and shock, that will avoid localized high spots in the connection between IC terminal and connector, that will provide a low contact resistance and that will provide a relatively high contact force coupled with a relatively low insertion force.

It is a further purpose of the invention to achieve the above purposes in combination with minimum degredation of the characteristics under repeated withdrawal and insertion of the IC circuit.

As is usually the case, it is an important purpose of this invention to provide all of the above characteristics in a context that has long life, requires minimum maintenance, is simple in design and has low costs in manufacture. These objectives are achieved by a specific design approach and invention as set forth in detail below.

BRIEF DESCRIPTION

In brief, one embodiment of this invention involves an intermediate connector having a base and a shell which snap together to provide a housing containing a series of pockets. The intermediate connector normally has a number of terminals, one associated with each pocket. Each terminal is a unitary, resilient, wire, rectangular in cross section and clad, preferably with gold, on one of the four surfaces from end-to-end. A lower end of the wire terminal extends out through the base to provide a prong for insertion into a printed circuit (PC) board. Where the upper part of the prong portion enters the pocket, the wire turns 90° to provide a retainer segment which abuts against the floor of the pocket and thus retains the terminal against being pulled out of the pocket. The retainer segment leads into a first straight segment that extends up against a first wall of the pocket, which straight segment then leads to a curved segment that curves around the top of the pocket. This curved segment leads to a second straight segment that extends down against a second wall of the pocket, which second straight segment then leads to an inwardly bent end segment that terminates close to the retainer segment. Because the spacing between the end segment and the retainer segment is less then the thickness of the wire itself, individual terminals do not become tangled up with one another prior to assembly. When the terminal of an integrated circuit (IC) is inserted into the pocket through a top opening in the pocket, the IC terminal comes into contact with the outwardly facing surface of the second straight segment which thus operates as a contact segment. Because of the U shape of the curved segment, this contact segment can flex to admit the IC terminal and will be resiliently biased outward to frictionally retain and establish good electrical contact with the IC terminal.

DRAWINGS

FIG. 1 is a cross-sectional schematic of the first embodiment of the intermediate connector of this invention showing an IC having a lead terminal inserted into the intermediate connector.

FIG. 2 illustrates the spring terminal used in the intermediate connector of FIG. 1 prior to being assembled into the pocket of the connector. FIG. 2A shows the terminal in cross-section.

FIG. 6 is a cross-sectional view, similar to that of FIG. 1, through a second embodiment of this invention; one adapted to be used with an integrated circuit having base pad terminals.

FIG. 7 is a cross-sectional view similar to that of FIG. 1 of a third embodiment of this invention; one adapted to be employed with an integrated circuit having side pad terminals.

DESCRIPTION OF THE PREFERRED EMBODIMENTS

Figure 3:
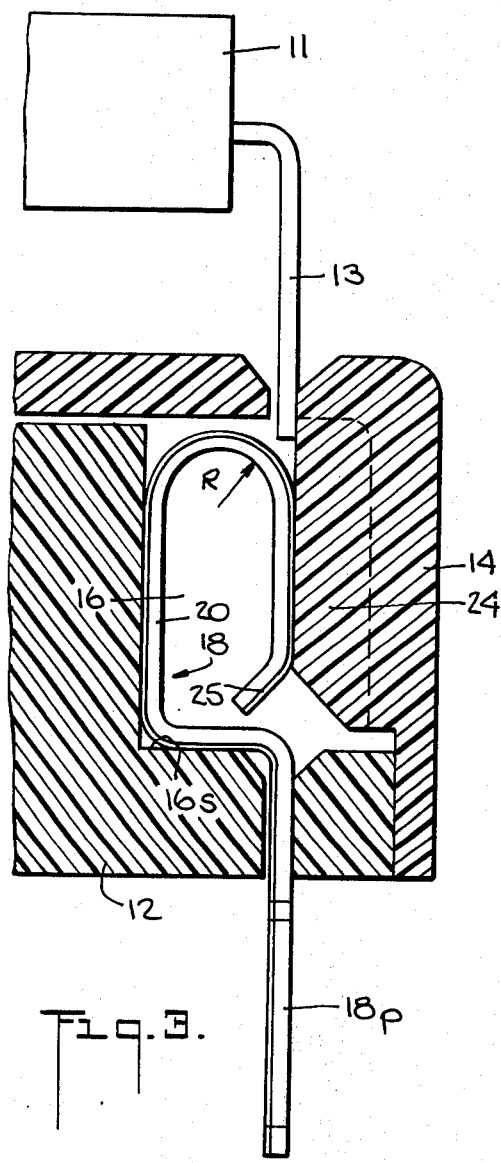
FIG. 3 shows the spring terminal assembled in the pocket of the intermediate connector with an IC terminal about to be inserted into the pocket.
Figure 4:
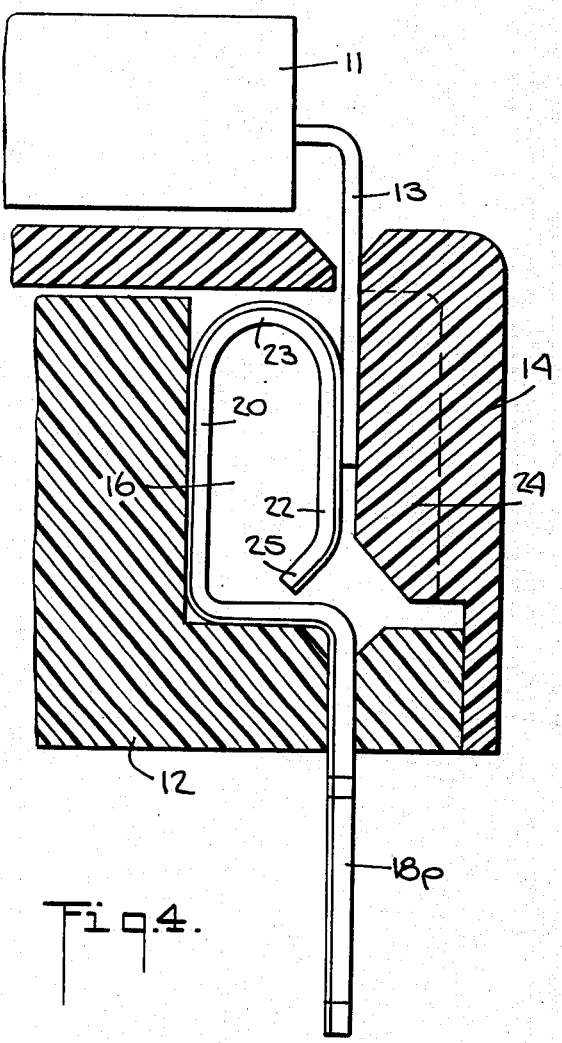
FIG. 4 is a view similar to that of FIG. 3 showing the IC terminal fully inserted into the pocket.
Figure 5:
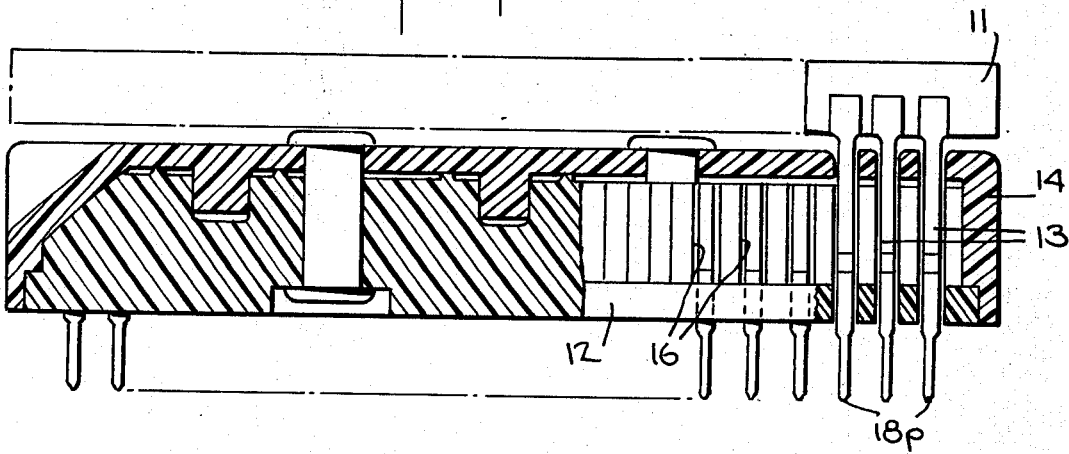
FIG. 5 is a longitudinal cross-section along the plane 5—5 of FIG. 1 illustrating the multiple pocket arrangement for the intermediate connector.

FIGS. 1–5 illustrate the first embodiment of the invention adapted for use with an integrated circuit (IC) 11 having terminals 13. In this embodiment, the intermediate connector 10 has a base member 12 and a shell member 14 which snap together as shown to provide a plurality of pockets 16. Each pocket 16 receives the upper portion of a resilient wire terminal 18. The resilient wire terminal 18 is shown longitudinally in FIG. 2 and in cross-section in FIG. 2. As shown in FIG. 2, the wire terminal 18 is rectangular in cross-section.

Each terminal 18 has a vertical portion 18p which extends through an opening in the base 12 to form the prong of the connector 10. This prong portion 18p may be, and usually will be, permanently soldered or otherwise permanently affixed to the printed circuit board with which the integrated circuit 12 is to be electrically associated. Above the prong portion 18p is a horizontal segment 18r which seats on the base surface 16s of the pocket 16 to retain the terminal 18 in the connector 10. Because of this retainer segment 18r, the terminal 18 cannot be pulled out through the bottom opening in the base 12. The rest of the terminal 18, is so constructed as to provide a spring bias that retains the IC terminal 13 in the connector 10. This curved portion includes a first straight segment 20, a curved segment 23, a second segment 22 and a turned-in end 25. The segment 20 is substantially parallel to the prong portion 18p. Assuming that the segment 20 and prong 18p are vertical, the contact segment 22 when unrestrained has an angle $\theta$ with the vertical. In one embodiment this angle $\theta$ is 15°. The dimensions of this terminal 18 are such that when mounted in the pocket 16 (see specifically FIG. 3) the support rib 24 of the housing shell 14 abuts against the end leg 22 and causes the leg 22 to rotate and become substantially vertical.

When in the pocket 16, the force of the rib 24 on the end leg 22 causes the leg 20 to abut against a vertical wall of the pocket 16. The reaction between the rib 24 and leg 22 also tends to cause the prong 18p to bear against the right hand portion of the opening in the base 12 (as seen in FIG. 3). More specifically (as seen in FIG. 3), the force on the end leg 22 causes the end leg 22 to rotate clockwise relative to the rest of the terminal 18 and also tends to cause the entire terminal 18 to adjust within the pocket 16. The upper part of the vertical wall of the pocket 16 may bear most firmly against the leg 20 and the lower part of the opening in the base 12 (through which the prong 18p extends) may bear most firmly against the prong 18p. Thus, the lower portion of the leg 20 may break away from the adjacent vertical wall of the pocket 16 somewhat and the upper portion of the prong 18p may break from the wall of the prong opening in the base 12. The amount of this break (if any) from the respective walls is slight and is not specifically shown in the figures. Indeed, the prong portion 18p and the retainer portion 18r can rotate relative to one another (in the plane of the terminal 18) to create contact of the prong 18p along the full length of the opening in the base 12. A similar adjustment in the geometry of the terminal 18 can cause the leg 20 to contact the pocket 16 wall along the full length of the leg 20.

A reason for this design is to prevent the terminal 18 from rattling around within the pocket 16. One segment 18r of the portion in the pocket 16 seats against the surface 16s, another portion 18p bears against the opening in the base 12, the straight segment 20 bears against the vertical wall in the pocket 16 and the contact segment 22 bear against the rib 24 thereby assuring that the terminal 18 is held firmly within the pocket 16. Furthermore, this arrangement assures positive maximum area contact between the terminal 18 and the IC terminal 13. In order for this firm holding of the terminal 18 within the pocket 16 to occur, the retainer segment 18r should be long enough so that the segment 20 and prong 18p are held substantially vertical.

On insertion of IC terminal 13, the curved segment 23 increases its curvature (that is, curls in and reduces the radius R) thus accommodating the width of the IC terminal 13. The contact segment 22 maintains its outward moment about the point A to maintain contact with the IC terminal 13. The curved segment 23 by increasing its curvature upon the insertion of the IC terminal 13 provides for the maintenance of an essentially vertical contact segment 22 and assures maximum area contact between the outwardly facing clad surface of the contact segment 22 and the IC terminal 13.

One advantage of the design shown is that the terminals 18 can be made out of a standard wire that is cut and shaped on a standard forming tool such as a four slide mechanism of the type used to make bobby pins and safety pins. When so made, the individual unassembled terminals 18 as shown in FIG. 2 would tangle except for the turned in end 25. The end 25 is spaced from the retainer segment 18r less than the thickness of the wire used but by enough so that on assembly and on insertion of the IC terminal 13, the end segment 25 will slip or slide over the retainer segment 18r and not bind against the retainer segment 18r.

In one embodiment where the terminal 18 is made from a wire 0.015 inches by 0.040 inches, the distance X (see FIG. 2) in the unassembled terminal 18 is between 0.005 and 0.010 inches.

As shown in FIG. 2, the terminal 18 contains a main section 18x on which there is a 0.2 mil (0.0002 inch) thick twenty four carat gold overlay 18z applied along the outwardly facing surface. To achieve true cladding, a 1 mil (0.001 inch) thick nickel interliner 18y is employed. This technology of gold cladding is known in the art. The base material of the terminal 18, specifically the portion 18x, is a copper alloy. ASTM Alloy No. 725 having a composition of 89% copper, 9% nickel and 2% tin and having a temper hardness of Rockwell B85290 has been used in an experimental sample.

The clad surface 18z is on the outwardly facing surface of the curved portion 18c to assure spring loaded contact with the IC terminal 13.

In one embodiment, the force required to insert the IC terminal 11 was 5 ounces, such being the force required to cause the curved segment 23 to curl in. However, once the terminal was inserted, the frictional force developed along the surface 18z of the leg 22 that is in contact with the terminal 13 is sufficiently great to require 20 ounces of force for withdrawal. These force magnitudes were the total required during insertion and withdrawal of an IC circuit 12 having fourteen terminals.

FIG. 6 illustrates a second embodiment in which the IC 111 has base pads as terminals. The housing base 112 and housing top 114 snap together to hold the IC 111 within the housing. The housing thereby formed also provides a series of pockets. In each pocket, the curved portion 118c of a separate terminal 118 is positioned. The terminal 118 extends through an opening in the base 112 to provide a prong portion. The curved portion 118c includes a transverse segment adjacent to the prong segment in order to retain the terminal within the pocket. As in the FIG. 1 embodiment, it is the outwardly facing surface of the terminal 118 which is clad and which is in contact with the terminal pad of the IC 111.

The FIG. 7 embodiment is adapted for use with an IC 211 having side pad terminals. The base 212 and top 214 snap together to hold the ICs 211 in position so that the terminals 218 will contact the side pads.

In all three embodiments shown, the curved portion when held in the pocket is held in a more closed curve than is the case when the terminal sits free outside the pocket. By being held in a more closed curve, a spring resilence is created which holds the outwardly facing clad surface of the terminal 18, 118, 218 in good electrical contact against a terminal of the IC.

What is claimed is:

1. In an intermediate connector to provide engagement between a printed circuit board having terminal openings and an integrated circuit or the like having terminals, the intermediate connector having a housing containing at least one pocket therein, the improvement in a terminal comprising:

a unitary, resilient, wire having a first end and a second end, a prong portion at the first end of said wire, said prong portion extending from below said housing into said housing, a pocket portion within the pocket of the housing, said pocket portion including a retainer segment connected to said prong portion, said retainer segment extending along the floor of said pocket, said pocket portion further including a curved segment, a contact segment and an end segment at said second end of said wire, said contact segment being between said curved segment and said end segment and positioned to have an outwardly facing surface in contact with whatever integrated circuit terminal is inserted into the intermediate connector, said curved segment positioned between said retainer segment and said contact segment, pressure normal to said outwardly facing surface of said contact segment causing said curved segment to increase its curvature, said end segment, at said second end of said wire, turned inward at an oblique angle to said contact segment and terminating above said retainer segment at a distance from said retainer segment substantially less than the least thickness of said wire, said pressure normal to said outwardly facing surface of said contact segment causing said end segment to move, said second end terminating above said retainer segment a distance sufficiently great so that said second end will clear said retainer segment when so moved.

2. The connector of claim 1 wherein:

said pocket portion includes a straight segment between said retainer segment and said curved segment, said straight segment lying against a first side wall of said pocket, said straight segment, said contact segment and said prong portion all being substantially parallel, said retainer segment being substantially transverse to said straight segment.

3. The connector of claim 2 wherein:

said housing has an opening through the top thereof to receive a terminal of an integrated circuit, said contact segment is resiliently biased against a second side wall of said pocket when the integrated circuit is disconnected from said connector, a terminal of said integrated circuit, when inserted into said opening, is resiliently held between said contact segment and said second side wall.

4. The connector of claim 1 wherein:

said housing has an opening through the top thereof to receive a terminal of an integrated circuit said contact segment is resiliently biased against a second side wall of said pocket when the integrated circuit is disconnected from said connector, a terminal of said integrated circuit, when inserted into said opening, is resiliently held between said contact segment and said second side wall.

* * * * *